(12) United States Patent
Park et al.

(10) Patent No.: US 6,747,390 B2
(45) Date of Patent: Jun. 8, 2004

(54) MICROMIRROR ACTUATOR

(75) Inventors: Hae-seok Park, Seoul (KR); Jun-hyub Park, Kyungki-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 228 days.

(21) Appl. No.: 09/988,314

(22) Filed: Nov. 19, 2001

(65) Prior Publication Data

US 2002/0067104 A1 Jun. 6, 2002

(30) Foreign Application Priority Data

Dec. 5, 2000 (KR) .................... 10-2000-73483

(51) Int. Cl.⁷ .................... G02B 26/08; G22B 26/10
(52) U.S. Cl. .................... 310/309; 385/18; 359/223; 359/291; 335/78
(58) Field of Search .................... 310/309; 359/291, 359/221, 224, 223, 225; 385/18, 13, 16; 335/78, 84

(56) References Cited

U.S. PATENT DOCUMENTS 6,046,840 A    4/2000  Huibers .................... 359/291
6,282,460 B2 * 8/2001  Gilliland et al. ............ 700/255
6,396,975 B1 * 5/2002  Wood et al. .................... 385/18
6,583,920 B2 * 6/2003  Yoon et al. .................... 359/290

FOREIGN PATENT DOCUMENTS

JP    6-230295    *  8/1994   .......... G02B/26/08
JP    2001-264652 *  9/2001   .......... G02B/26/08

* cited by examiner

Primary Examiner—Karl Tamai
(74) Attorney, Agent, or Firm—Burns, Doane, Swecker & Mathis, L.L.P.

(57) ABSTRACT

A micromirror actuator is provided. The micromirror actuator includes a substrate, posts formed to a predetermined height on the substrate and spaced a predetermined distance apart, a torsion bar fixed to the posts, a mirror coupled to the torsion bar, and a groove including an inclined contact surface and formed in the substrate. Here, the inclined contact surface contacts the lower bottom surface of the mirror when the mirror is rotated. The micromirror actuator can be applied to a structure in which a plurality of micromirror actuators are arrayed side-by-side and is capable of precisely and stably maintaining the rotation angle of a mirror, particularly, stably maintaining the inclination angle of the mirror irrespective of an increase in the strength of a magnetic field.

8 Claims, 9 Drawing Sheets

MICROMIRROR ACTUATOR

Priority is claimed to Patent Application number 2000-73483 filed Dec. 5, 2001 in the Republic of Korea, herein incorporated by reference.

BACKGROUND OF THE INVENTION

1. Field of the Invention

The present invention relates to a micromirror actuator, and more particularly, to a micromirror actuator which is capable of precisely adjusting the inclination angle of a mirror.

2. Description of the Related Art

Micromirror actuators are optical switching devices used in optical transmission devices and holographic optical data recorders. In holographic optical data recorders, mirrors are required to be placed at precise positions for correctly changing an optical path or switching. A plurality of micromirror actuators are installed in an array in a holographic optical data recorder and must show the same mirror operational characteristics.

Figure 1:
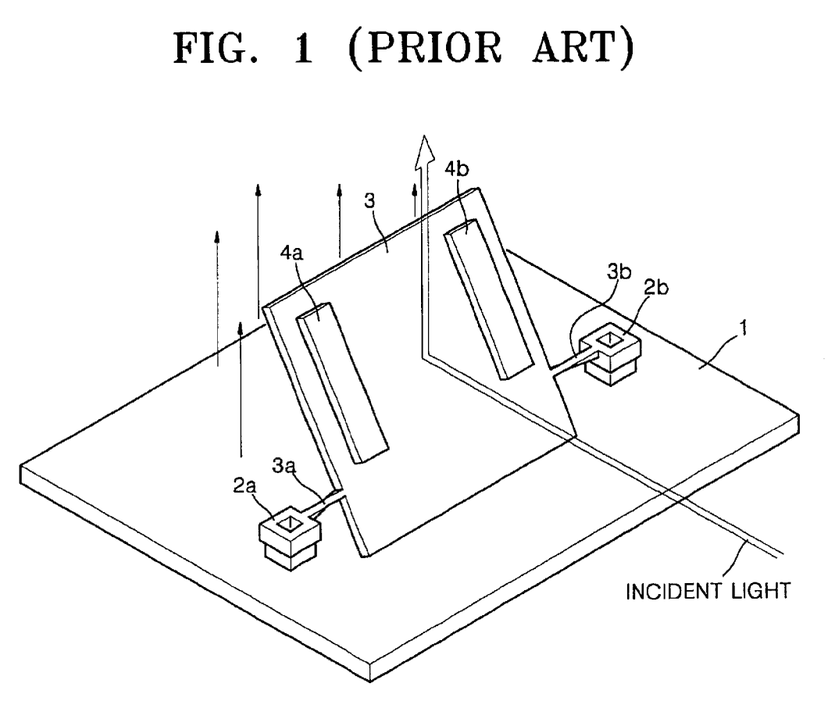
FIG. 1 is a perspective view showing a conventional micromirror actuator in a state in which a mirror is rotated.

FIG. 1 illustrates a conventional micromirror actuator, in which two posts 2a and 2b are installed a predetermined distance apart on a substrate 1, and torsion bars 3a and 3b are formed to extend from a mirror 3. The torsion bars 3a and 3b are respectively connected to two posts 2a and 2b at one end. In addition, magnets 4a and 4b are placed at two opposite sides of the mirror 3.

Referring to FIG. 1, the mirror 3 inclines over the substrate 1 by a predetermined angle due to a vertical magnetic field emanating from the substrate 1. Here, one edge of the mirror 3 is in contact with the surface of the substrate 1, and thus the inclination angle of the mirror 3 with respect to the substrate 1 can be maintained. When the mirror inclines over the substrate 1, the torsion bars 3a and 3b having predetermined elastic forces are twisted.

Figure 2:
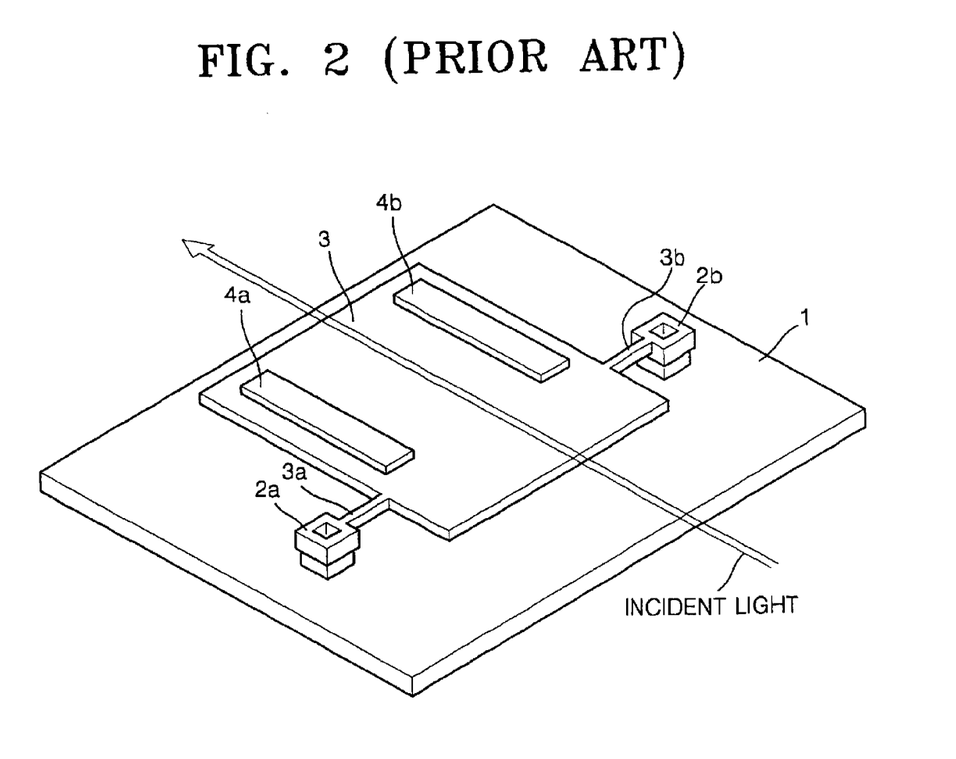
FIG. 2 is a perspective view showing the conventional micromirror actuator shown in FIG. 1 in a state which the mirror is restored to its original state.

FIG. 2 illustrates the conventional micromirror actuator of FIG. 1 in a state where there is no magnetic field. If the magnetic field affecting the micromirror actuator of FIG. 1 is removed, as illustrated in FIG. 2, the mirror 3 rotates about the torsion bars 3a and 3b so as to be parallel with the surface of the substrate 1 due to the elastic restoring forces of each of the torsion bars 3a and 3b.

As shown in FIG. 1, when the mirror 3 is inclined over the substrate 1 by 45 degrees, light, which enters the micromirror actuator of FIG. 1 parallel to the surface of the substrate 1, is reflected perpendicular to the substrate 1 by the mirror 3. On the other hand, light, which enters the micromirror actuator of FIG. 2, directly passes over the surface of the mirror 3 without being reflected by the mirror 3. The operation of the micromirror actuator is controlled by the external magnetic field mentioned above. In most cases, an electromagnet is attached on the bottom surface of the substrate 1 in order to form such a vertical magnetic field.

Figure 3:
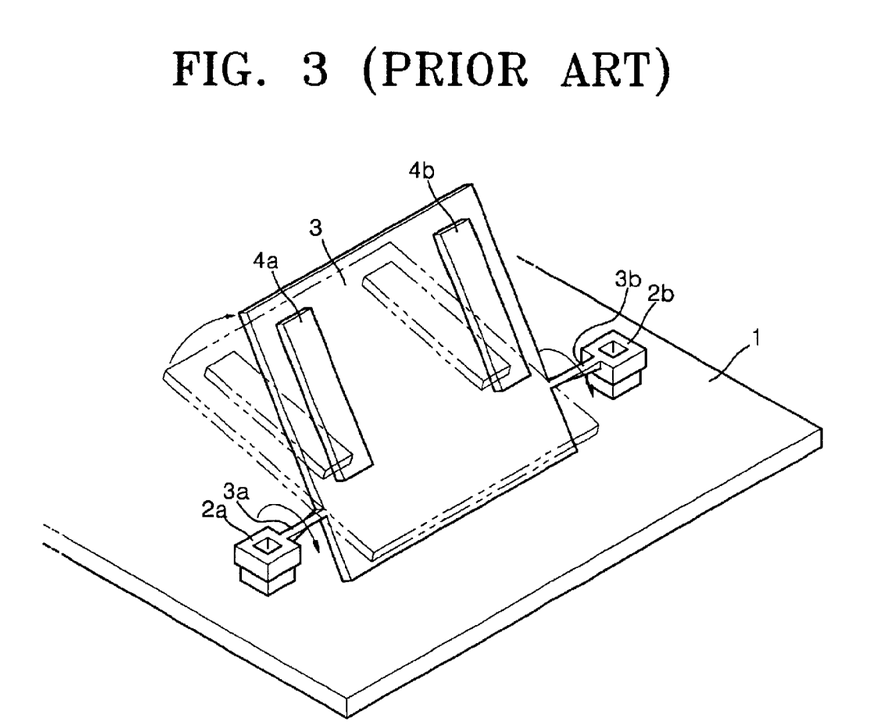
FIG. 3 is a perspective view of the conventional micromirror actuator shown in FIG. 1 in a state in which the mirror is rotated and torsion bars are twisted.

As shown in FIG. 3, when an external magnetic field is formed, the mirror 3 can rotate about the torsion bars 3a and 3b against the elastic forces of the torsion bars 3a and 3b so as to form a predetermined angle with the substrate 1. On the other hand, when there is no external magnetic field, the mirror 3 rotates so as to be parallel with the surface of the substrate 1 due to the elastic restoring forces of the torsion bars 3a and 3b.

Figure 4:
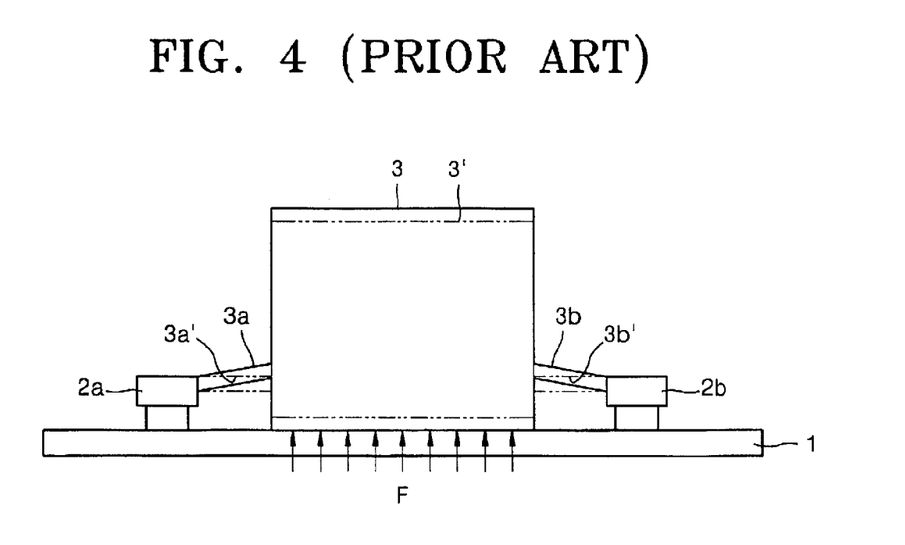
FIG. 4 is a perspective view showing abnormally deformed torsion bars due to over-rotation of the mirror in the conventional micromirror actuator shown in FIG. 1.

However, as shown in FIG. 4, if a strong external magnetic field is applied to the microactuator after one edge of the mirror 3 has contacted the surface, the torsion bars 3a and 3b cannot maintain their straight shapes and are inevitably bent due to their flexibility. Here, the fact that the torsion bars 3a and 3b cannot maintain their straight shapes, means that the rotation axis of the mirror 3 changes and accordingly, the rotation angle of the mirror 3 exceeds a desired level. The torsion bars 3a and 3b are supported at one end by the posts 2a and 2b, respectively. Accordingly, it becomes difficult to obtain a normal inclination angle of the mirror 3 in the conventional actuator, in which the mirror 3 and the torsion bars 3a and 3b are connected to one another. Dotted lines 3a' and 3b' in FIG. 4 indicate the original shapes of the torsion bars 3a and 3b, respectively, before the lower edge of the mirror 3 contacts the substrate 1 and the torsion bars are abnormally deformed. Solid lines in FIG. 4 indicate the shapes of the torsion bars 3a and 3b, respectively, abnormally deformed due to the rotation of the mirror 3.

As described above, if the mirror 3 is sufficiently rotated until one edge of the mirror 3 contacts the surface of the substrate 1 and thus the torsion bars 3a and 3b are deformed, the rotation center of the mirror changes, and the rotation angle of the mirror 3 exceeds a designed angle range. Accordingly, it is impossible to reflect light in a desired direction in an apparatus using the conventional micromirror actuator as an optical switching device.

SUMMARY OF THE INVENTION

To solve the above-described problems, it is an object of the present invention to provide a micromirror actuator which is capable of precisely adjusting the rotation angle of a mirror.

Accordingly, to achieve the above object, there is provided a micromirror actuator including a substrate, posts formed to a predetermined height on the substrate and spaced a predetermined distance apart, a torsion bar fixed to the posts, a mirror coupled to the torsion bar, and a groove including an inclined contact surface and formed in the substrate. Here, the inclined contact surface contacts the lower bottom surface of the mirror when the mirror is rotated.

Preferably, a driving electrode or a clamping electrode for generating electrostatic forces to clamp the mirror is formed on the inclined contact surface of the groove.

Preferably, the torsion bar is formed on the same plane as the mirror and the mirror is formed to rotate about the torsion bar.

Preferably, a plurality of magnets are arranged on an area of the mirror corresponding to the inclined contact surface.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 5:
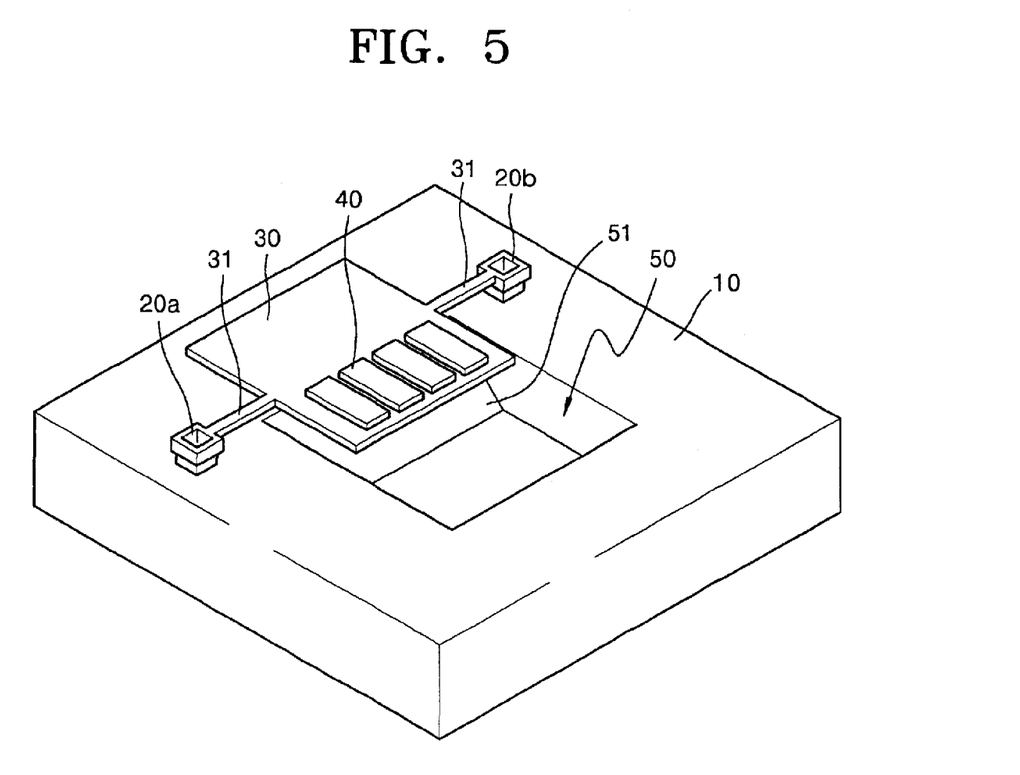
FIG. 5 is a schematic perspective view showing a micromirror actuator according to a first embodiment of the present invention.

Referring to FIG. 5, in a micromirror actuator according to a first embodiment of the present invention, posts 20a and 20b having a predetermined height are formed a predetermined distance apart on a substrate 1. A straight torsion bar 31 is fixed to the posts 20a and 20b. A mirror 30 is installed in the middle of the torsion bar 31.

The torsion bar 31 is installed on the same plane as the mirror 30, and the mirror moves about the torsion bar 31 like a seesaw.

A groove 50 is formed to a predetermined depth in the substrate 10, and an inclined contact surface 51 which will contact the lower bottom surface of the mirror 30 is formed at one side of the groove 50. A plurality of magnets 40 are arranged at predetermined positions on the mirror 30 so that they correspond to the inclined contact surface 51.

Figure 6:
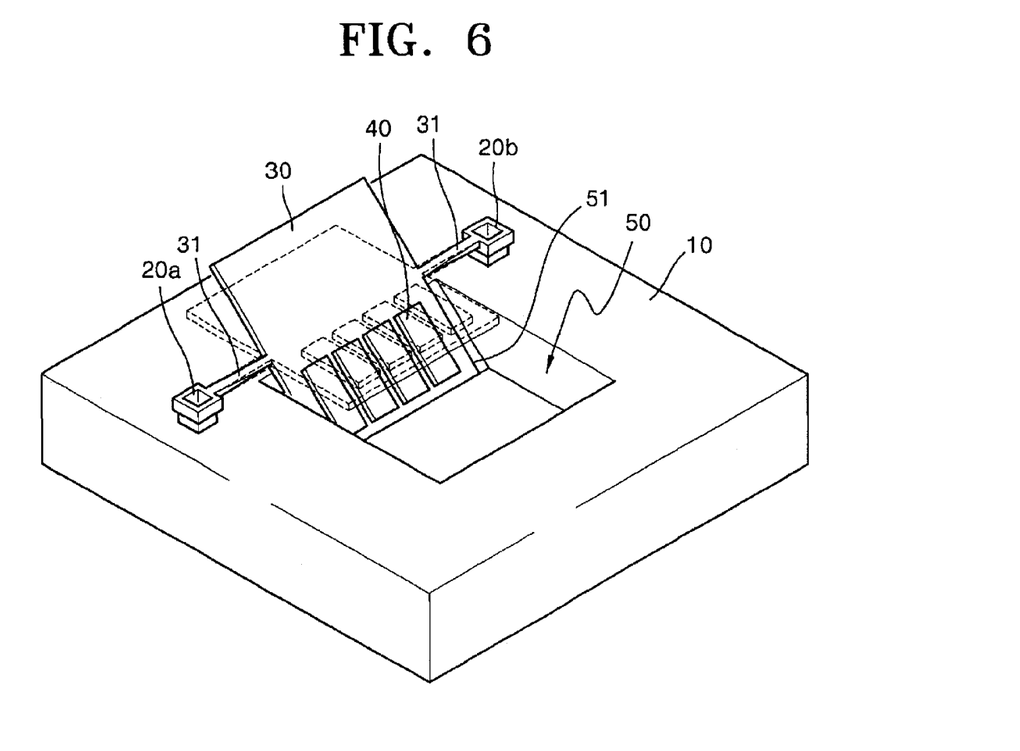
FIG. 6 is a perspective view showing the micromirror actuator according to a first embodiment of the present invention shown in FIG. 5 in a state in which a mirror is rotated.

Referring to FIG. 6, if an external magnetic field is applied to the magnets 40, the mirror 30 is rotated by a predetermined angle and then the lower bottom surface of the mirror 30 contacts the inclined contact surface 51 of the groove 50.

As long as the mirror 30 contacts the inclined contact surface 51, the mirror 30 maintains the inclination state, irrespective of additional application of an external magnetic field having a greater force to the magnets 40.

Figure 7:
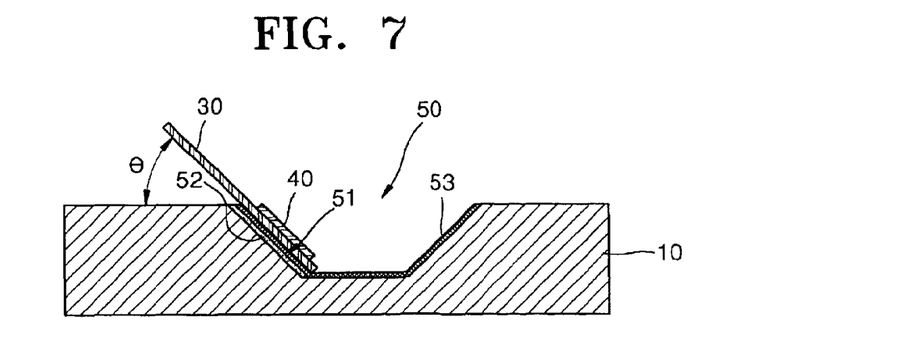
FIG. 7 is a cross-sectional view showing the micromirror actuator according to a first embodiment of the present invention shown in FIG. 5 in a state in which the mirror is rotated.

As shown in FIG. 7, a clamping electrode 52 is formed on the inclined contact surface 51 and an insulating layer 53 is formed over the entire surface of the groove 50. Accordingly, if a predetermined voltage is applied to the mirror 30 and the clamping electrode 52, electrostatic forces are generated, and thus the lower bottom surface of the mirror 30 is strongly clamped to the inclined contact surface 51 by the elastic forces.

The clamping electrode 52 is very effective in stably maintaining the operation of the mirror 30, particularly, the inclination angle of the mirror 30.

Hereinafter, a method for manufacturing a micromirror actuator according to a first embodiment of the present invention having such a structure will be described more fully with reference to FIGS. 8A through 8G. The elements of the micromirror actuator according to the present invention, which have been mentioned above, will be directly applied to the following description.

Figure 8A:
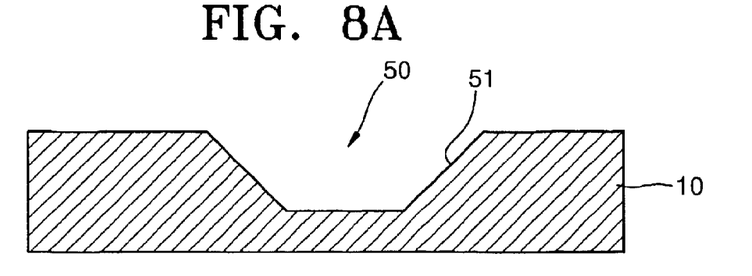
FIGS. 8A through 8G are cross-sectional views illustrating a method for manufacturing a micromirror actuator according to a first embodiment of the present invention.

Referring to FIG. 8A, the groove 50 including the inclined contact surface 51 is formed in the substrate 10 by dry or wet etching.

Figure 8B:
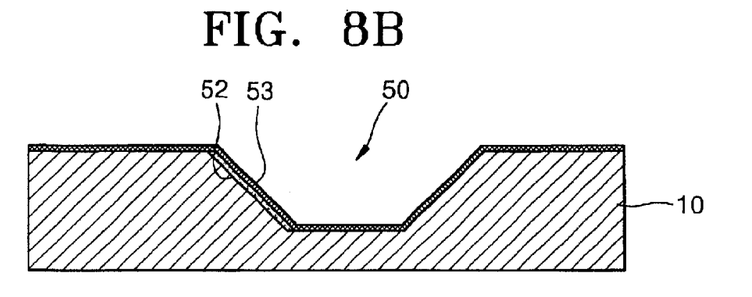

Referring to FIG. 8B, the clamping electrode 52 is formed of aluminium on the inclined contact surface 51, and then the insulating layer 53 is formed of silicon dioxide ($SiO_2$) over the entire surface of the groove 50.

Figure 8C:
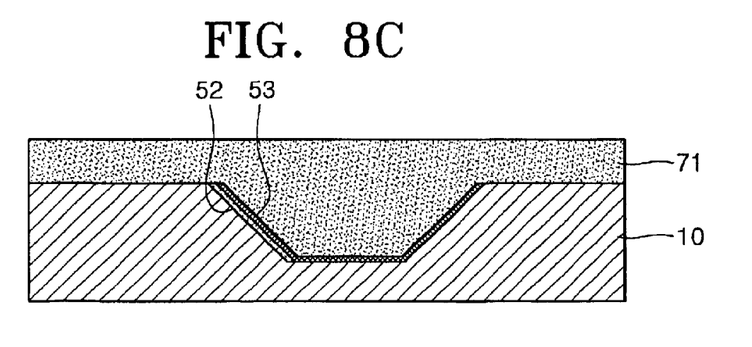

Referring to FIG. 8C, a sacrificial layer 71 is formed of photoresist to a predetermined thickness on the substrate 10 so that the groove 50 is completely filled with the sacrificial layer 71.

Figure 8D:
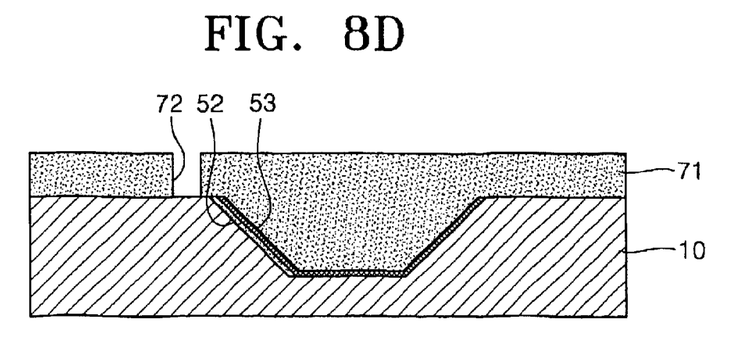

Referring to FIG. 8D, a well 72 is formed through the sacrificial layer 71 for forming the posts 20a and 20b such that the surface of the substrate 10 is exposed through the well 72. The opening of the well 72 has a size of 5 $\mu$m×5 $\mu$m.

Figure 8E:
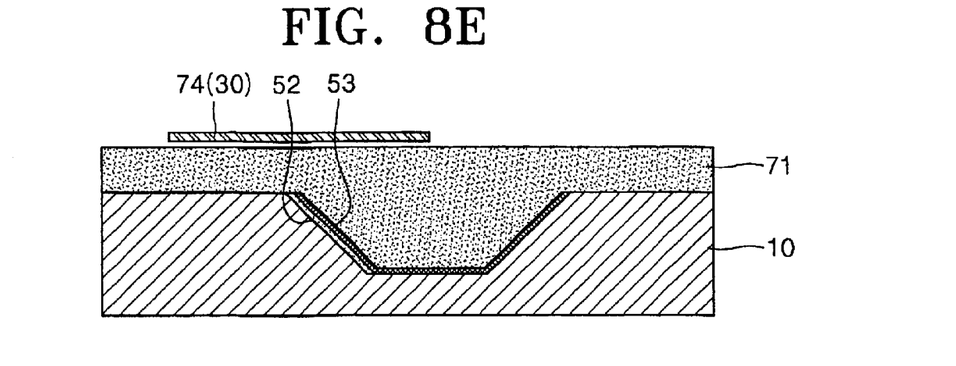

Referring to FIG. 8E, a metal layer 74 is formed of aluminium to a predetermined thickness on the sacrificial layer 71 so that the well 72 prepared for the posts 20a and 20b is filled with the metal layer 74 and thus the posts 20a and 20b are formed. Then, the metal layer 74 is etched into a predetermined pattern, thus forming the mirror 30 and the torsion bar connected to the mirror 30. Accordingly, the posts 20a and 20b, the torsion bar 31, and the mirror 30 are formed into an integrated body.

Figure 8F:
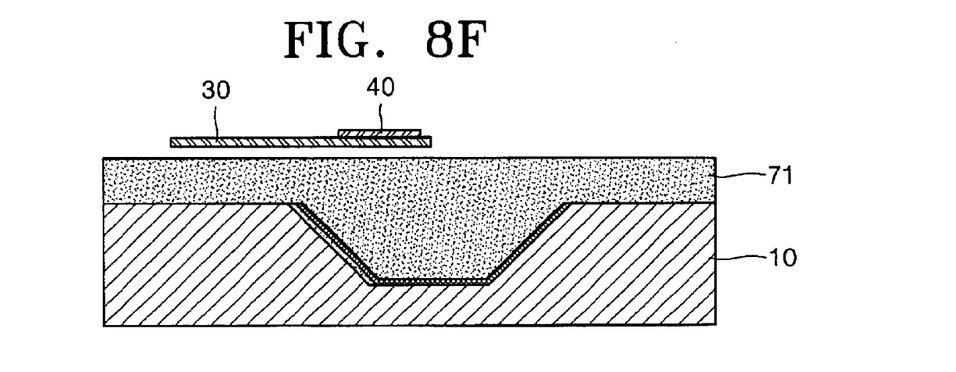

Referring to FIG. 8F, the magnets 40, which are panel-shaped, are formed at predetermined positions on the mirror 30 corresponding to the inclined contact surface 51. The magnets 40 are formed of a metal such as Fe, Ni—Fe, Ni, or Cr. The magnets 40 are formed by electrolytic plating using a predetermined panel-shaped mask. For the electrolytic plating, a layer is previously formed of chrome or gold on the area to be occupied by the magnets 40, which is a very common process in typical electrolytic plating.

Figure 8G:
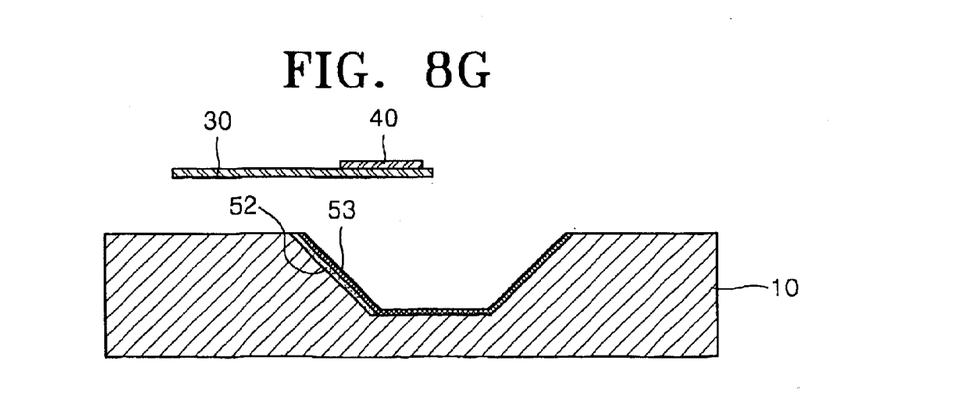

Referring to FIG. 8G, the sacrificial layer 71 is removed, thus completing the micromirror actuator shown in FIGS. 5 through 7. Here, the sacrificial layer 71 is preferably removed by dry etching using $O_2$ plasma.

As described above, if the mirror 30 inclines over the substrate 10 maintaining a predetermined angle, in general 45 degrees, due to an external magnetic field, light incident on the micromirror actuator parallel to the surface of the substrate 10 will be reflected in a direction perpendicular to the surface of the substrate 10. When an external magnetic field is no longer applied, the torsion bar 31 acts to return the mirror 30 inclined over the substrate 10 to its original state of being parallel to the surface of the substrate 10. If the external magnetic field is applied in a direction perpendicular to the substrate 10, as described above, the magnets 40 formed on the mirror 30 tends to follow the direction of the external magnetic field, and thus the mirror begins to rotate about the torsion bar 31 while overcoming the elastic forces of the torsion bar 31. The rotation angle of the mirror 30 is the angle at which magnetic torque applied by the external magnetic field and the opposing elastic forces of the torsion bar 31 reach an equilibrium state. As the strength of the external magnetic field increases, the rotation angle of the mirror 30 increases to the extent that the lower bottom surface of the mirror 30 contacts the inclined contact surface 51 of the groove 50. Thus, the maximum rotation angle of the mirror 30 is determined by the inclination contact surface 51. Therefore, even if the strength of the external magnetic field continuously increases, it is possible to maintain the inclined angle of the mirror 30 and prevent the torsion bar 31 from being abnormally deformed.

Figure 9:
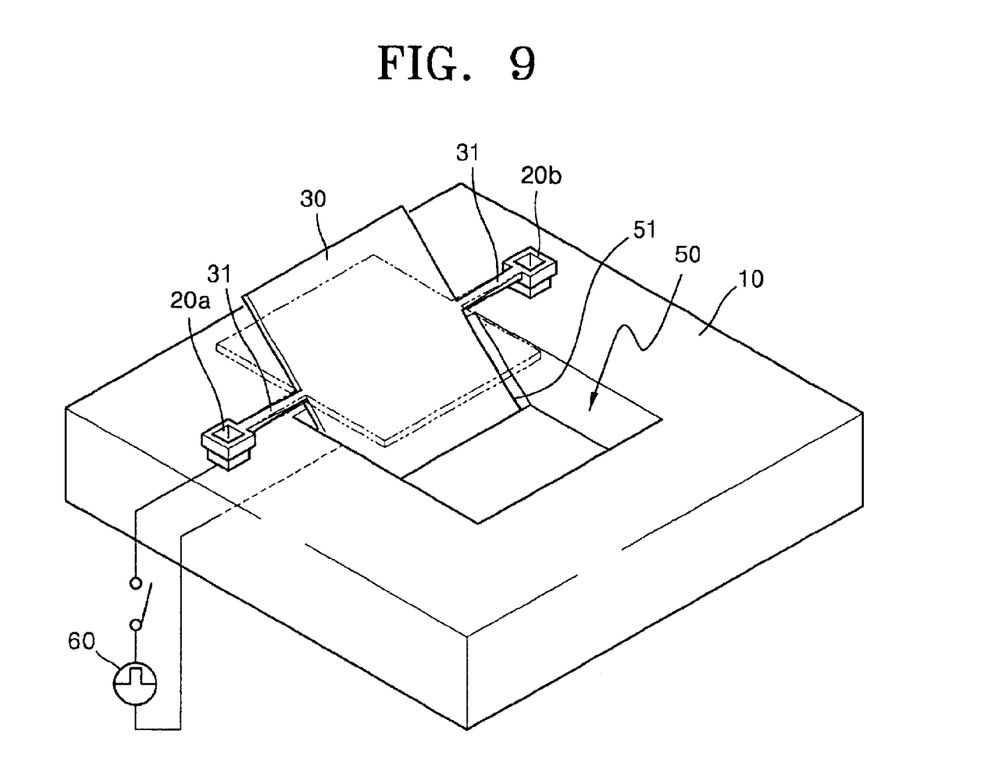
FIG. 9 is a perspective view illustrating a micromirror actuator according to a second embodiment of the present invention.
Figure 10:
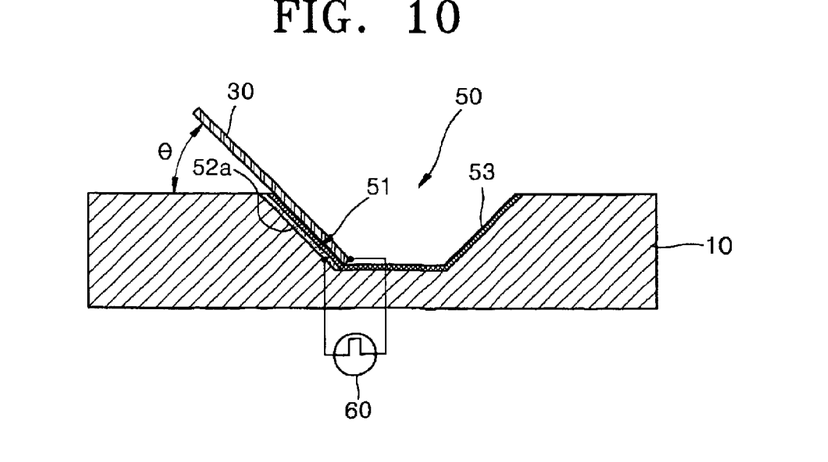
FIG. 10 is a cross-sectional view illustrating a method for manufacturing a micromirror actuator according to a second embodiment of the present invention.

FIG. 9 is a perspective view illustrating a micromirror actuator according to a second embodiment of the present invention, and FIG. 10 is a cross-sectional view illustrating the micromirror actuator shown in FIG. 9. In the micromirror actuator according to a second embodiment, the mirror is driven by electrostatic forces. Thus, the micromirror actuator according to the second embodiment of the present invention needs a means for driving the mirror 30 different from that of the micromirror actuator according to the first embodiment of the present invention, which is driven by magnetic forces. In the second embodiment, the clamping electrode, which has been described as clamping the mirror 30 to the inclined contact surface 51 of the substrate 10 in the first embodiment, serves as a driving electrode 52a. In other words, in the second embodiment, the magnets 40 are removed, and a predetermined driving voltage is applied from a power supply 60 to the driving electrode 52a formed contacting the inclined contact surface 51 and the mirror 30. Accordingly, in the second embodiment, the mirror 30 must be formed of a conductive material, such as Al or SiAl, and a dielectric material must be interposed between the driving electrode 52a and the mirror 30. Here, the dielectric material may be a general electric dielectric material and may be formed at the surface of the driving electrode 52a, like in the second embodiment, or at the bottom of the mirror 30. In the second embodiment, an insulating layer 53 is formed as the dielectric material. Voltage is applied to the mirror via the posts 20a and 20b. Driving voltage is applied from the external power supply 60 to the posts 20a and 20b, and the driving electrode 52a via a signal line (not shown). Such method of supplying driving voltage to the elements of the micromirror actuator can be easily realized by a typical MEMS technology, and thus its detailed description will not be presented here.

As described above, the micromirror actuator according to the present invention can be applied to a structure in which a plurality of micromirror actuators are arrayed side-by-side and is capable of precisely and stably maintaining the rotation angle of a mirror, particularly, stably maintaining the inclination angle of the mirror irrespective of an increase in the strength of a magnetic field.

What is claimed is:

1. A micromirror actuator comprising:

a substrate;

posts formed to a predetermined height on the substrate and spaced a predetermined distance apart;

a torsion bar fixed to the posts;

a mirror coupled to the torsion bar;

a groove including an inclined contact surface and formed in the substrate, the inclined contact surface contacting a lower, bottom surface of the mirror when the mirror is rotated; and a magnet for generating forces to drive the mirror taking advantage of an external magnetic field, the magnet formed at one end of the mirror relative to said torsion bar corresponding to the inclined contact surface and a reflective surface on the other end of the mirror, such that when said mirror contacts said inclined contact surface at said one end, said reflective surface reflects light traveling parallel to a plane of said substrate of said other end.

2. The micromirror actuator of claim 1 further comprising;

a clamping electrode for generating electrostatic forces to clamp the mirror, the clamping electrode formed on the inclined contact surface of the groove.

3. The micromirror actuator of claim 1, wherein the torsion bar is formed on the same plane as the mirror and the mirror is formed to rotate about the torsion bar.

4. The micromirror actuator of claim 2, wherein the torsion bar is formed on the same plane as the mirror and the mirror is formed to rotate about the torsion bar.

5. The micromirror actuator of claim 4, wherein a plurality of magnets are arranged on the end of the mirror corresponding to the inclined contact surface.

6. The micromirror actuator of claim 1, wherein a plurality of magnets are arranged on the end of the mirror corresponding to the inclined contact surface.

7. The micromirror actuator of claim 2, wherein the torsion bar is formed on the same plane as the mirror and the mirror is formed to rotate about the torsion bar.

8. The micromirror actuator of claim 2, wherein a plurality of magnets are arranged on the end of the mirror corresponding to the inclined contact surface.

* * * * *